United States Patent
Lai et al.

(10) Patent No.: US 11,195,724 B1
(45) Date of Patent: Dec. 7, 2021

(54) METHOD OF MANUFACTURING SEMICONDUCTOR STRUCTURE

(71) Applicant: NANYA TECHNOLOGY CORPORATION, New Taipei (TW)

(72) Inventors: Jen-I Lai, Taoyuan (TW); Chun-Heng Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/919,077

(22) Filed: Jul. 1, 2020

(51) Int. Cl.
*H01L 21/311* (2006.01)
*H01L 21/02* (2006.01)

(52) U.S. Cl.
CPC .... *H01L 21/31111* (2013.01); *H01L 21/0217* (2013.01); *H01L 21/0228* (2013.01); *H01L 21/0234* (2013.01); *H01L 21/02123* (2013.01); *H01L 21/02164* (2013.01); *H01L 21/02266* (2013.01)

(58) Field of Classification Search
CPC ......... H01L 21/31111; H01L 21/02123; H01L 21/02164; H01L 21/0217; H01L 21/02266; H01L 21/0228; H01L 21/0234
See application file for complete search history.

(56) References Cited

U.S. PATENT DOCUMENTS

| | | | |
|---|---|---|---|
| 2004/0235253 A1 | 11/2004 | Kim | |
| 2012/0074498 A1 | 3/2012 | Chuang et al. | |
| 2019/0006419 A1* | 1/2019 | Kiyotoshi | H01L 27/11582 |
| 2020/0251576 A1* | 8/2020 | Thees | H01L 29/66818 |

FOREIGN PATENT DOCUMENTS

TW 201814860 A 4/2018

* cited by examiner

*Primary Examiner* — Zandra V Smith
*Assistant Examiner* — Andre C Stevenson
(74) *Attorney, Agent, or Firm* — CKC & Partners Co., LLC

(57) ABSTRACT

A method of manufacturing a semiconductor structure includes the following operations. A substrate embedded with a shallow trench isolation is received. A first dielectric layer is formed on the substrate. An etching process is performed to form a hole in the first dielectric layer and form a pit in the substrate, wherein an upper surface of the shallow trench isolation is exposed from the hole, and the pit is adjacent to the shallow trench isolation. A second dielectric layer is formed on the first dielectric layer and the shallow trench isolation and in the pit. The second dielectric layer is treated with a plasma to convert a first portion of the second dielectric layer substantially on the first dielectric layer and the shallow trench isolation to a plasma-treated layer. The plasma-treated layer is removed to remain a second portion of the second dielectric layer in the pit.

10 Claims, 5 Drawing Sheets

METHOD OF MANUFACTURING SEMICONDUCTOR STRUCTURE

BACKGROUND

Field of Invention

The present disclosure relates to a method of manufacturing a semiconductor structure.

Description of Related Art

The semiconductor integrated circuit (IC) industry has experienced rapid growth and has strived for higher device density, higher performance, and lower costs. However, problems involving both fabrication and design have been encountered. For example, during an etching process, over-etching may occur, and thus may cause some problems, such as undesirable current leakage, undesirable conduction between electronic elements, or lowering device reliability.

In view of this, it is necessary to develop a new method to prevent the above problems occurring in the etching process.

SUMMARY

The present disclosure provides a method of manufacturing a semiconductor structure. The method includes the following operations. A substrate embedded with a shallow trench isolation is received. A first dielectric layer is formed on the substrate. An etching process is performed to form a hole in the first dielectric layer and form a pit in the substrate, wherein an upper surface of the shallow trench isolation is exposed from the hole, and the pit is adjacent to the shallow trench isolation. A second dielectric layer is formed on the first dielectric layer and the shallow trench isolation and in the pit. The second dielectric layer is treated with a plasma to convert a first portion of the second dielectric layer substantially on the first dielectric layer and the shallow trench isolation to a plasma-treated layer. The plasma-treated layer is removed to remain a second portion of the second dielectric layer in the pit.

In some embodiments, treating the second dielectric layer with the plasma includes oxidizing the first portion of the second dielectric layer or reducing the first portion of the second dielectric layer.

In some embodiments, a material of the second dielectric layer is same as that of the substrate.

In some embodiments, the second dielectric layer includes a material selected from a group consisting of silicon, silicon nitride, and silicon dioxide.

In some embodiments, when the second dielectric layer includes silicon, wherein the plasma is an oxygen plasma.

In some embodiments, when the second dielectric layer includes silicon nitride, wherein the plasma is an oxygen plasma.

In some embodiments, when the second dielectric layer includes silicon dioxide, wherein the plasma is a hydrogen plasma.

In some embodiments, the second dielectric layer has a substantially uniform thickness.

In some embodiments, the second dielectric layer is formed by chemical vapor deposition (CVD), physical vapor deposition (PVD), or atomic layer deposition (ALD).

In some embodiments, the plasma-treated layer is removed by an etching process.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
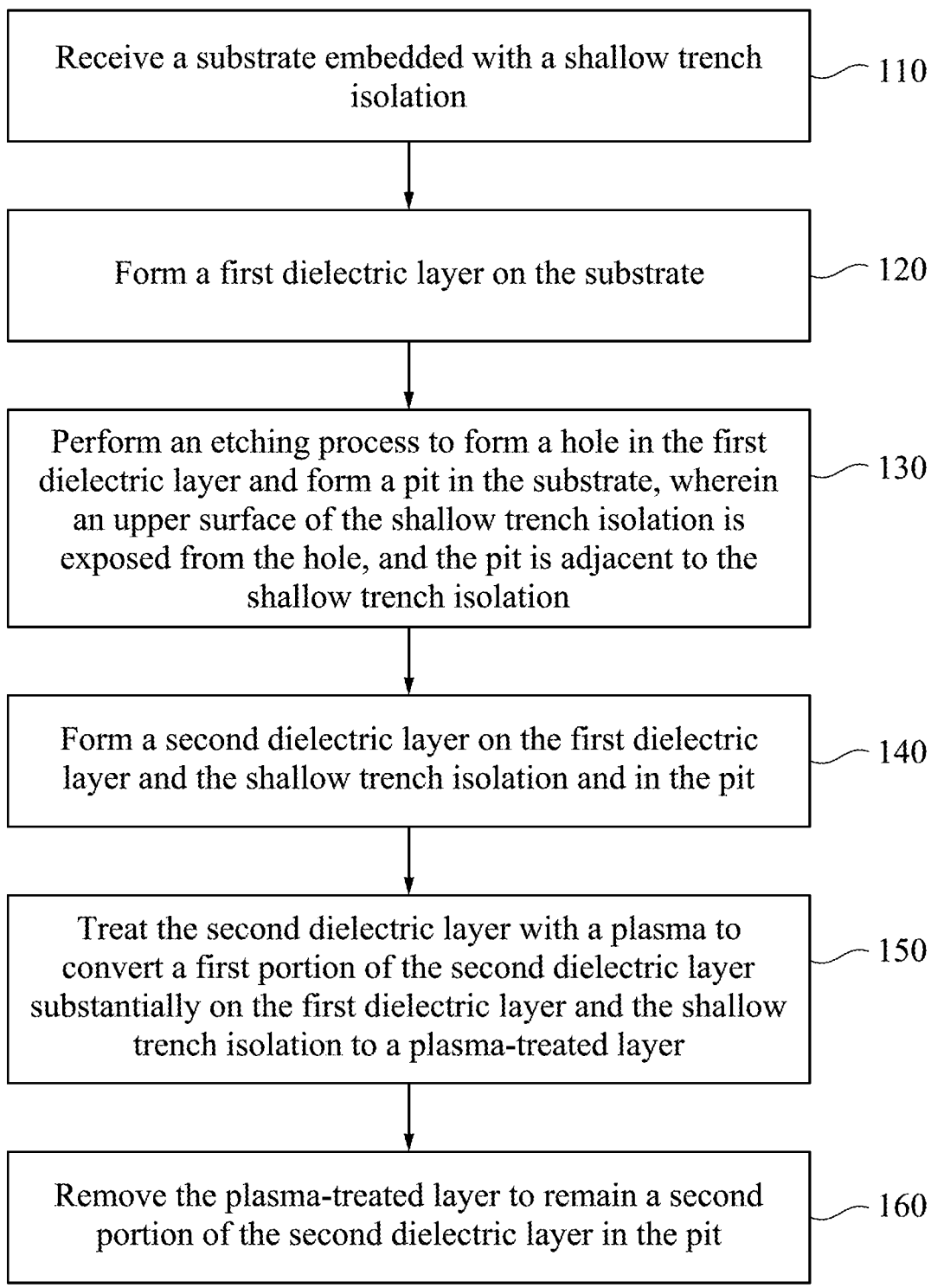
FIG. 1 is a flowchart of a method for manufacturing a semiconductor structure, in accordance with some exemplary embodiments of the present disclosure.

Reference will now be made in detail to the present embodiments of the, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

The present disclosure provides a method for manufacturing a semiconductor structure. FIG. 1 is a flowchart of a method 100 for manufacturing a semiconductor structure, in accordance with some exemplary embodiments of the present disclosure. Operation 110 of the method is receiving a substrate embedded with a shallow trench isolation. The method continues with operation 120 in which a first dielectric layer is formed on the substrate. Operation 130, an etching process is performed to form a hole in the first dielectric layer and form a pit in the substrate, wherein an upper surface of the shallow trench isolation is exposed from the hole, and the pit is adjacent to the shallow trench isolation. The method continues with operation 140 in which a second dielectric layer is formed on the first dielectric layer and the shallow trench isolation and in the pit. The method continues with operation 150 in which the second dielectric layer is treated with a plasma to convert a first portion of the second dielectric layer substantially on the first dielectric layer and the shallow trench isolation to a plasma-treated layer. Operation 160, the plasma-treated layer is removed to remain a second portion of the second dielectric layer in the pit. It is understood that FIG. 1 has been simplified for a good understanding of the concepts of the present disclosure. Accordingly, it should be noted that additional processes may be provided before, during, and after the methods of FIG. 1, and that some other processes may only be briefly described herein.

FIGS. 2-8 are cross-sectional views illustrating intermediate stages in the manufacturing of a semiconductor structure, in accordance with some exemplary embodiments of the present disclosure.

Figure 2:
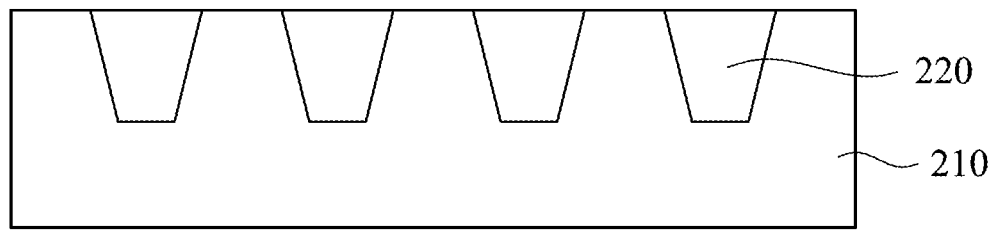
FIGS. 2-8 are cross-sectional views illustrating intermediate stages in the manufacturing of a semiconductor structure, in accordance with some exemplary embodiments of the present disclosure.

Reference is made to FIG. 2. A substrate 210 embedded with a shallow trench isolation (STI) 220 is received (the operation 110 of FIG. 1). In some embodiments, the substrate 210 is a bulk semiconductor, a semiconductor-on-insulator (SOI) substrate, or the like. For example, the substrate 210 may be a wafer, such as a silicon wafer. Generally, an SOI substrate includes an insulator layer and a layer of a semiconductor material thereon. For example, the insulator layer may be a buried oxide (BOX) layer, a silicon oxide layer, or the like. The insulator layer is provided on a substrate, a silicon, or a glass substrate. Other substrates, such as a multi-layered or gradient substrate may also be used. In some embodiments, the semiconductor material of the substrate 210 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Still referring to FIG. 2. In some embodiments, the shallow trench isolation 220 is made of silicon oxide, silicon nitride, silicon oxynitride, fluoride-doped silicate glass (FSG), or other low-K dielectric materials. In some embodiments, the shallow trench isolation 220 may be formed by using a high-density-plasma (HDP) chemical vapor deposition (CVD) process, using silane ($SiH_4$) and oxygen ($O_2$) as reacting precursors. In some other embodiments, the shallow trench isolation 220 may be formed using a sub-atmospheric CVD (SACVD) process or high aspect-ratio process (HARP), wherein process gases may comprise tetraethylorthosilicate (TEOS) and ozone ($O_3$). In yet other embodiments, the shallow trench isolation 220 may be formed using a spin-on-dielectric (SOD) process, such as hydrogen silsesquioxane (HSQ) or methyl silsesquioxane (MSQ). Other processes and materials may be used.

Figure 3:
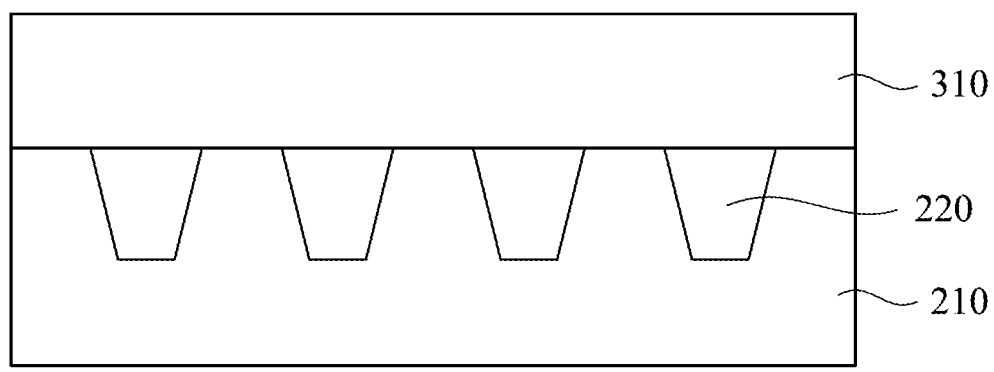

Please refer to FIG. 3, a first dielectric layer 310 is formed on the substrate 210 (the operation 120 of FIG. 1). In some embodiments, some electronic elements, such as field-effect transistors (FETs), may be formed in the first dielectric layer 310 (not shown in FIG. 3). The manufacturing process of the electronic elements will not be described here. In some embodiments, the first dielectric layer 310 includes one or more layers of a Si-based insulating material containing Si with O, N, C, B and or H, or an Al-based insulating material containing Al with O, N, C, B and or H. Examples of the first dielectric layer 310 include SiN, SiCN, SiC, SiCON, $AlO_x$, $AlN_x$ and $AlN_xO_y$.

Figure 4:
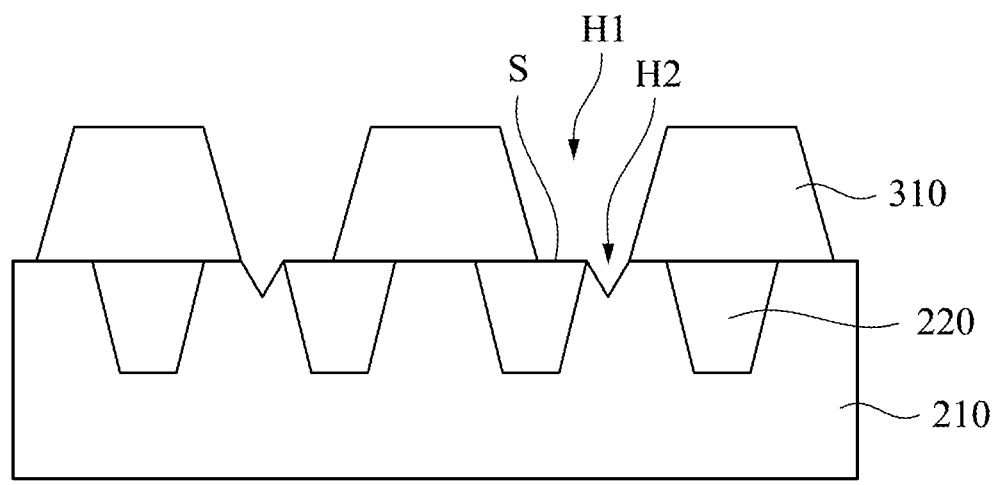

Reference is made to FIG. 4. An etching process is performed to form a hole H1 in the first dielectric layer 310 and form a pit H2 in the substrate 210, wherein an upper surface S of the shallow trench isolation 220 is exposed from the hole H1, and the pit H2 is adjacent to the shallow trench isolation 220 (the operation 130 of FIG. 1). More specifically, during the etching process, the etchant not only etches the first dielectric layer 310 but also partially etches the surface of the substrate 210 to form the pit H2. In other words, the pit H2 is caused by an over-etching. The pit H2 is a defect, and probably causes problems, such as undesirable current leakage, undesirable conduction between electronic elements, or lowering device reliability. The following FIGS. 5-8 illustrate how to fill the pit H2.

Figure 5:
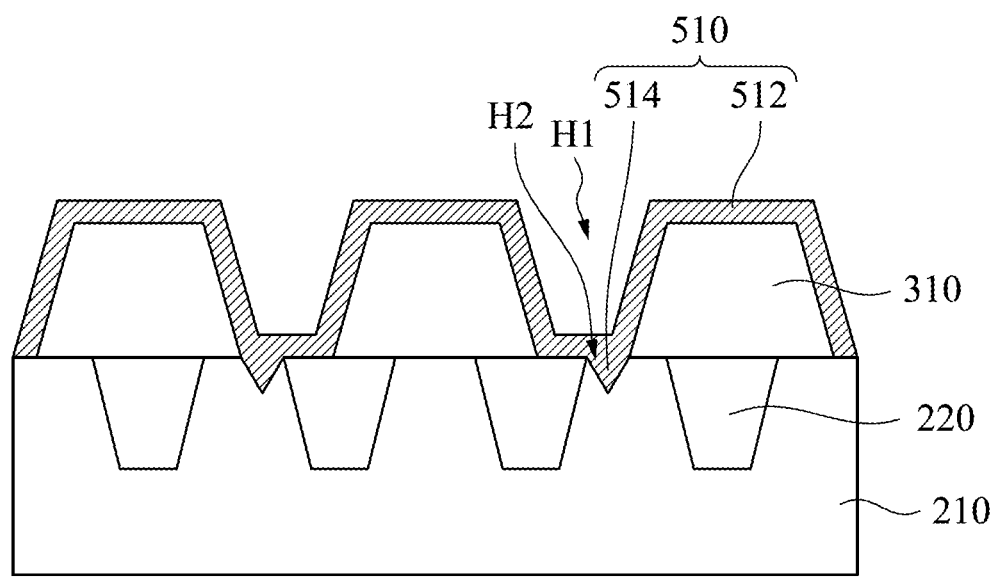

Attention is now invited to FIG. 5. A second dielectric layer 510 is formed on the first dielectric layer 310 and the shallow trench isolation 220 and in the pit H2 (the operation 140 of FIG. 1). Therefore, the pit H2 is filled with the second dielectric layer 510. As shown in FIG. 5, the second dielectric layer 510 has a portion 512 and a portion 514. The portion 512 is substantially disposed on the first dielectric layer 310 and the shallow trench isolation 220. The portion 514 is disposed in the pit H2. In some embodiments, the second dielectric layer 510 has a substantially uniform thickness. In other words, the second dielectric layer 510 substantially conformally covers the first dielectric layer 310, the shallow trench isolation 220, and the substrate 210. In some embodiments, the second dielectric layer 510 is formed by chemical vapor deposition (CVD), physical vapor deposition (PVD), or atomic layer deposition (ALD). In some embodiments, a material of the second dielectric layer 510 is same as that of the substrate 210. In some embodiments, the second dielectric layer 510 is an oxide layer or a nitride layer. In some embodiments, the second dielectric layer 510 includes a material selected from a group consisting of silicon, silicon nitride, and silicon dioxide.

Figure 6:
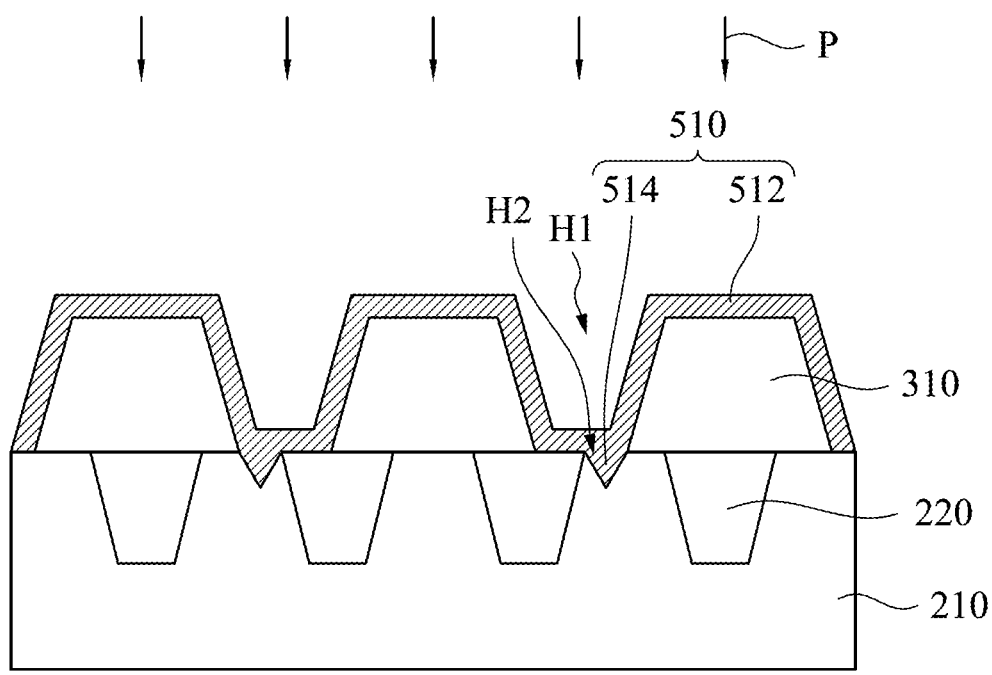
Figure 7:
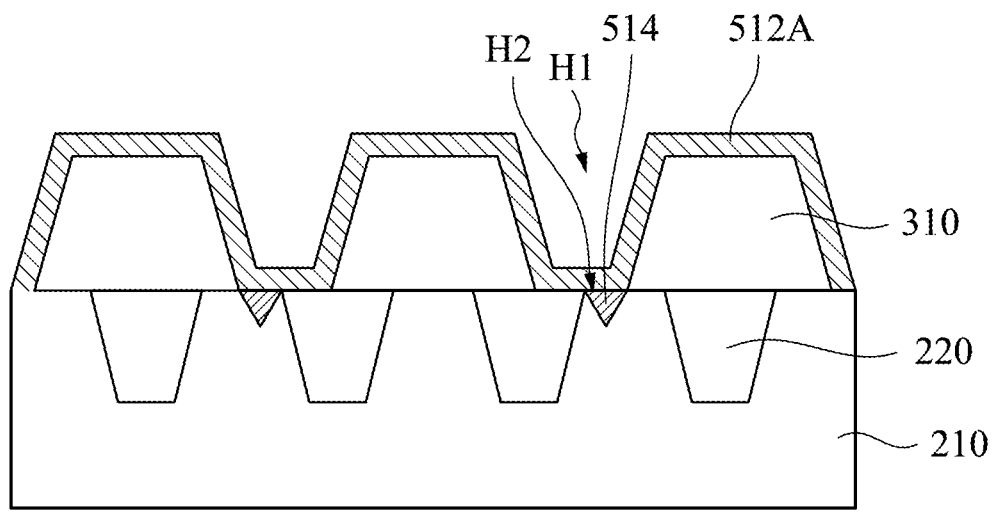

Reference is made to FIGS. 6-7. The second dielectric layer 510 is treated with a plasma P as shown in FIG. 6 to convert a portion of the second dielectric layer 510 substantially on the first dielectric layer 310 and the shallow trench isolation 220 to a plasma-treated layer 512A as shown in FIG. 7 (the operation 150 of FIG. 1). In other words, the surface portion of the second dielectric layer 510 is treated by the plasma P. In some embodiments, treating the second dielectric layer 510 with the plasma P includes oxidizing a portion of the second dielectric layer 510 or reducing a portion of the second dielectric layer 510. For example, the second dielectric layer 510 may be oxidized by an oxygen plasma or reduced by a hydrogen plasma. In other words, in some embodiments, the plasma P is an oxygen plasma or a hydrogen plasma.

In some embodiments, when the second dielectric layer 510 includes silicon, wherein the plasma P is an oxygen plasma. Silicon is oxidized as silicon dioxide by the oxygen plasma, and therefore the plasma-treated layer 512A includes silicon dioxide. In some embodiments, when the second dielectric layer 510 includes silicon nitride, wherein the plasma P is an oxygen plasma. Silicon nitride is oxidized as silicon oxynitride by the oxygen plasma, and therefore the plasma-treated layer 512A includes silicon oxynitride. In some embodiments, when the second dielectric layer 510 includes silicon dioxide, wherein the plasma P is a hydrogen plasma. Silicon dioxide is reduced as silicon, and therefore the plasma-treated layer 512A includes silicon.

Figure 8:
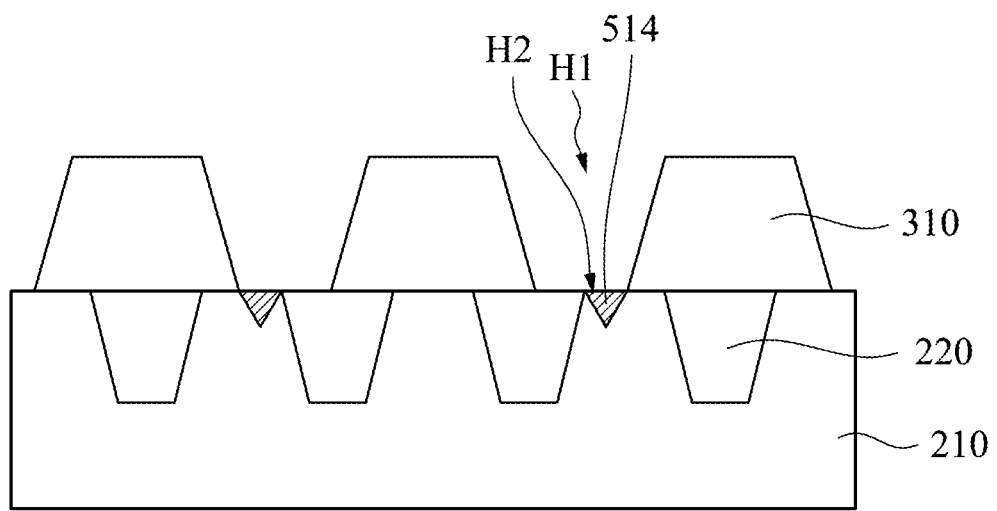

Turning now to FIG. 8. The plasma-treated layer 512A is removed to remain the portion 514 of the second dielectric layer 510 in the pit H2 (the operation 160 of FIG. 1). Therefore, a semiconductor structure is formed as show in FIG. 8. In some embodiments, the upper surface of the portion 514 of the second dielectric layer 510 substantially aligns with the upper surface of the shallow trench isolation 220. In other words, the upper surface of the portion 514 of the second dielectric layer 510 is substantially coplanar with the upper surface of the shallow trench isolation 220. As shown in FIG. 8, the pit H2 in the substrate 210 is filled with the second dielectric layer 510. Therefore, the previously mentioned problems, such as undesirable current leakage, undesirable conduction between electronic elements, or lowering device reliability, can be avoided.

In some embodiments, the plasma-treated layer 512A is removed by an etching process. In some embodiments, the plasma-treated layer 512A includes silicon, and silicon can be etched by using $NH_4OH$, $HNO_3+HF$, or $HNO_3+HF+CH_3COOH$ as an etchant. In some embodiments, the plasma-treated layer 512A includes silicon oxynitride, and silicon oxynitride can be etched by using $H_3PO_4$ as an etchant. In some embodiments, the plasma-treated layer 512A includes silicon dioxide, and silicon dioxide can be etched by using HF, HF+NH$_4$F, or NH$_4$F+H$_3$PO$_4$ as an etchant.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a semiconductor structure, comprising:
    receiving a substrate embedded with a shallow trench isolation;
    forming a first dielectric layer on the substrate;
    performing an etching process to form a hole in the first dielectric layer and form a pit in the substrate, wherein an upper surface of the shallow trench isolation is exposed from the hole, and the pit is adjacent to the shallow trench isolation;
    forming a second dielectric layer on the first dielectric layer and the shallow trench isolation and in the pit;
    treating the second dielectric layer with a plasma to convert a first portion of the second dielectric layer substantially on the first dielectric layer and the shallow trench isolation to a plasma-treated layer; and
    removing the plasma-treated layer wherein a second portion of the second dielectric layer remains in the pit.

2. The method of claim 1, wherein treating the second dielectric layer with the plasma comprises oxidizing the first portion of the second dielectric layer or reducing the first portion of the second dielectric layer.

3. The method of claim 1, wherein a material of the second dielectric layer is same as that of the substrate.

4. The method of claim 1, wherein the second dielectric layer comprises a material selected from a group consisting of silicon, silicon nitride, and silicon dioxide.

5. The method of claim 4, when the second dielectric layer comprises silicon, wherein the plasma is an oxygen plasma.

6. The method of claim 4, when the second dielectric layer comprises silicon nitride, wherein the plasma is an oxygen plasma.

7. The method of claim 4, when the second dielectric layer comprises silicon dioxide, wherein the plasma is a hydrogen plasma.

8. The method of claim 1, wherein the second dielectric layer has a substantially uniform thickness.

9. The method of claim 1, wherein the second dielectric layer is formed by chemical vapor deposition (CVD), physical vapor deposition (PVD), or atomic layer deposition (ALD).

10. The method of claim 1, wherein the plasma-treated layer is removed by an etching process.

* * * * *